United States Patent [19]

Kubota et al.

[11] Patent Number: 5,226,582
[45] Date of Patent: Jul. 13, 1993

[54] METHOD FOR WIRE-BONDING AN INTEGRATED CIRCUIT

[75] Inventors: Akihiro Kubota; Mitsunada Osawa, both of Kawasaki, Japan

[73] Assignee: Fujitsu Limited, Kawasaki, Japan

[21] Appl. No.: 880,027

[22] Filed: May 8, 1992

[30] Foreign Application Priority Data

May 9, 1991 [JP] Japan .................................. 3-102990

[51] Int. Cl.⁵ .................. B23K 31/02; H01L 21/60
[52] U.S. Cl. .................................. 228/179; 219/56.22
[58] Field of Search ............... 228/111, 213, 110, 179, 228/4.5; 219/56.1, 56.22

[56] References Cited

U.S. PATENT DOCUMENTS

| | | | |
|---|---|---|---|
| 4,445,633 | 5/1984 | Bonham, Jr. ......................... | 228/179 |
| 4,597,522 | 7/1986 | Kobayashi ........................ | 219/56.22 |
| 4,845,543 | 7/1989 | Okikawa et al. .................... | 420/550 |
| 5,111,989 | 5/1992 | Holdgrafer et al. ................. | 228/179 |

FOREIGN PATENT DOCUMENTS

| | | | |
|---|---|---|---|
| 0409582 | 1/1991 | European Pat. Off. ............ | 228/179 |
| 56-162847 | 12/1981 | Japan ................................ | 219/56.22 |

*Primary Examiner*—Richard K. Seidel
*Assistant Examiner*—Jeanne M. Elpel
*Attorney, Agent, or Firm*—Staas & Halsey

[57] ABSTRACT

A wire-bonding method of an IC uses a capillary having a hole for guiding a bonding wire, the capillary moving vertically and horizontally with respect to the IC so as to bridge a loop between a first bonding and a subsequent second bonding of the wire on predetermined places. The method comprises the steps of heating a wire end extruding from a first opening of the hole to form a ball of the wire; performing the first bonding by a nail head bonding method; pulling the wire coming from the second opening. The tension imposed on the wire hardens a portion of the wire having been softened during the heating process, but is adequately low not break the wire; and moving the capillary so as to perform the second bonding. In a wire-bonding apparatus including a spool and a capillary having a hole to guide the wire therethrough, where the capillary does a first bonding by a nail head bonding method and is movable vertically and horizontally so as to bridge a loop between the first bonding and a subsequent second bonding, there is provided a tension bar, located behind the capillary and rectangular to the wire, to hook the wire at a portion between the capillary and the spool located apart from the center line of the hole. The tension bar is movable from the capillary so as to pull the wire via the hole from the first bonding thus completed. Thus imposed tension hardens the portion of the wire soften by the heat process.

7 Claims, 7 Drawing Sheets

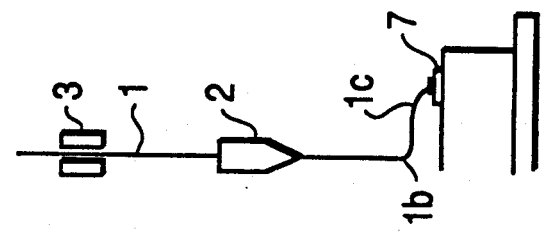
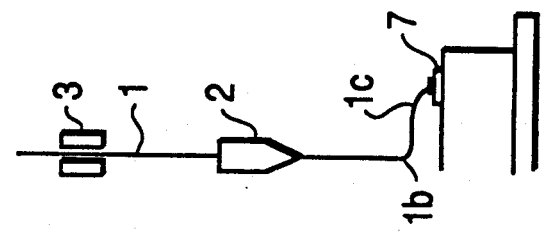
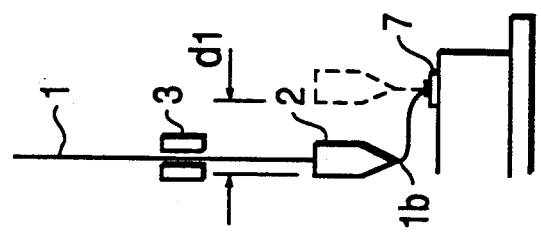
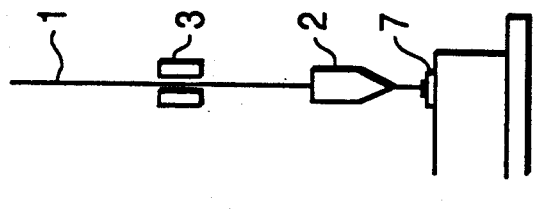
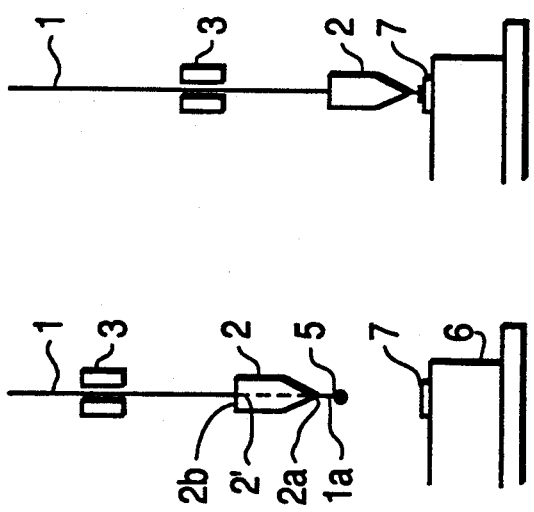

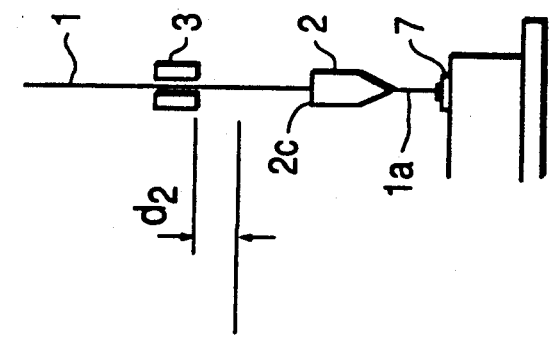
FIG. 3(d)
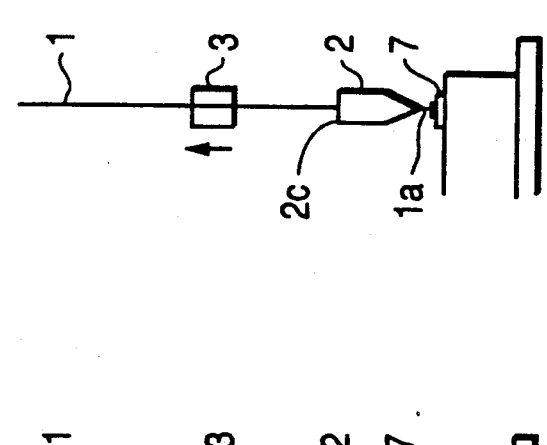
FIG. 3(c)
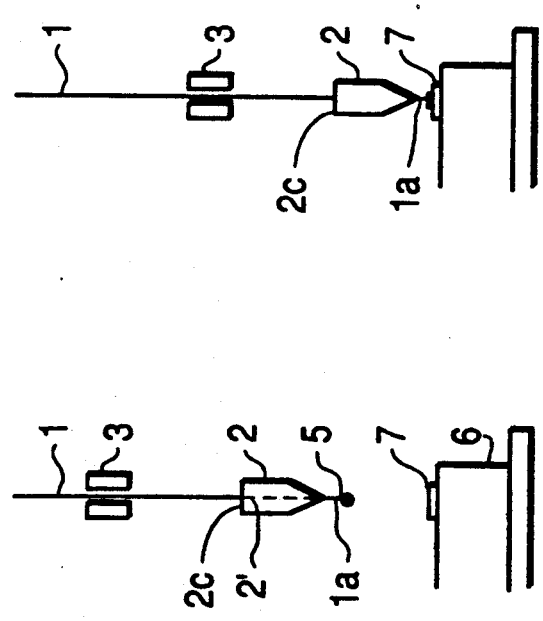
FIG. 3(b)
FIG. 3(a)

METHOD FOR WIRE-BONDING AN INTEGRATED CIRCUIT

BACKGROUND OF THE INVENTION

Field of the Invention

This invention relates to a method of wire bonding. More particularly this invention relates to a wire-bonding method that employs a capillary having an axial hole or passageway therethrough, to guide a wire therethrough to a first bonding position at which a first bonding operation is performed. The capillary then is moved from the first bonding position to a second bonding position at which a second bonding operation is performed, a loop of the wire thus bridging the gap, or distance, between the first bonding and the second bonding positions. This bonding method has been employed for providing a wire-connection between a semiconductor chip and a lead frame or a package, in fabricating a semiconductor device.

Description of the Related Arts

Today, improvements of the integration density and the operation speed in semiconductor devices, typically LSIs (large-scale integrated circuits), are remarkable. Accordingly, in the packaging technique, it is also remarkable that the decrease in the pitch of pins has allowed more compact packages, an increased number of pins and denser integration.

In this kind of package, the wire-bonding is required to provide a long loop having a span as long as 3 to 7 mm. Therefore, not only the wire material itself has to be improved but also it is essential to control the wire loop between the first and second bonding positions.

FIG. 1 schematically illustrates a typical wire bonder to perform the above-required bonding; the numeral 1 denotes a wire to be bonded, the numeral 2 denotes a capillary tube having a hole 2' (i.e., an axial passageway, or bore) to guide the wire running therethrough, the numeral 11 denotes a bonding head for moving the capillary 2 in the Z direction (i.e., vertically in the view of FIG. 1) to bond the wire selectively to electrodes on an IC (integrated circuit) chip or on the package, the numeral 12 denotes an X-Y table for selectively moving bonding head 11 in X and Y directions (i.e., in a plane perpendicular to the X axis and thus to the plane of the view of FIG. 1, in which the Y direction is orthogonal to the view of FIG. 1), the numerals 13, 14, 15 respectively denote an X direction motor ("X-MTR"), a Y direction motor ("Y-MTR") and a Z direction motor ("Z-MTR"), the numeral 16 denotes a TV camera ("T.V.") for viewing the wire loop under fabrication, the numeral 17 denotes a TV monitor to display the view of TV camera 16, the numeral 18 denotes a circuit for recognizing the pattern caught by the camera ("RECOG. CKT"), the numeral 19 denotes a bonding control circuit ("BONDING CONT. CKT.") and the numeral 20 denotes motor drive circuits ("MOTOR DR. CKT'S"), the numeral 21 denotes a carrier system ("CARR. SYS.") to carry an object on which the bonding is to be carried out and the numeral 22 denotes a microscope for eye observation of the loop. The numeral 23 denotes a spool from which wire 1 is supplied.

Movement of capillary 2 ("CAP.") is programmed in advance in the bonding control circuit 19 to roughly determine the locations where the bonding are to be made. Then, final capillary location is finely determined by electronically recognizing the accurate location of the bonding position from the signal output from TV camera 16.

In FIGS. 2(a)–2(h), respective steps (a) to (h) of a prior art method to perform the first and second bonding are schematically illustrated. Wire 1, typically of gold supplied from spool 23, is inserted into a hole 2' provided along the axis of capillary 2 and the wire's leading, or free, end 1a is extruded from a front end 2a (i.e., the lower end in the figure) of the capillary. Clamp 3 located behind the rear end 2b of capillary 2 moves together with capillary 2 and clamps wire 1 when required. The numeral 4 denotes a torch (see FIG. 2(h), discussed hereafter) to generate an electrical discharge arc onto the extruding wire end so that the wire becomes molten and forms a ball 5; the numeral 6 denotes a semiconductor chip; the numeral 7 denotes an electrode provided on the semiconductor chip at which the first bonding is to be performed; and the numeral 8 (FIGS. 2(f) and 2(g)) denotes a frame lead at which the second bonding is to be performed.

FIG. 2(a) shows the first step, i.e. step (a), of the bonding, where ball 5 has been formed at the free end 1a of the wire, as explained later in step (h), and clamp 3 is open.

In the next step (b), the first bonding is performed onto electrode 7 by a nail head bonding method, and clamp 3 is kept open.

In the next step (c), capillary 2 and clamp 3 move upwards while wire 1 is kept as it is.

In the next step (d), capillary 2 and clamp 3 horizontally move as far as a distance $d_1$ to a position opposite the second bonding to be made.

In the next step (e), capillary 2 and clamp 3 move upwards so as to make a permanent bend 1b in wire 1.

In the next step (f), capillary 2 and clamp 3 move directly (i.e., linearly) or via an arc-shaped path, called a loop, to the second bonding position, and the second bonding operation is carried out by a stitch bonding method. In these steps clamp 3 is kept open. This process of FIGS. 2(e) to 2(f) is known as a reverse bonding step, due to the initial movement of the capillary in a direction opposite to the direction from the first to the second bonding positions.

In the next step (g), capillary 2 moves up for a predetermined distance, and then clamp 3 is closed in order to prevent an excessive protrusion of the wire. Capillary 2 and clamp 3 further move up together so as to cut the wire from the bond of the free end 1a thereof with lead 8.

In the next step (h), the free end 1a of the wire 1 extruding from the capillary 2 is rendered molten by the electric arc generated by the torch 4 to form ball 5, by the surface tension of the molten gold, at the end of the wire. The next bonding cycle then is repeated from step (a).

It is an important requirement for the thus-formed loop to have no sag or deformation which permits the loop to touch other wiring. However, when the ball 5 is formed, the heat imparted to the wire softens the part of the wire adjacent to the ball 5. This is because recrystallization of the wire 1 in the free end portion 1a adjacent to ball 5 causes both softening as well as weakening of the wire material. Accordingly, the permanent bend 1b is necessary for a long span of the loop. The longer the span, the longer the distance of the reverse stroke $d_1$ which is required, resulting in a greater bending angle at the wire neck 1c portion at the first bonding position.

Thus, the longer span results in a higher loop, which in turn is subjected to a greater force of injected resin during a subsequent transfer molding process and corresponding increased load imposed onto the wire neck portion 1c.

A problem of the prior art reverse bonding method arises in that the greater reverse stroke for the longer span causes the wire neck portion 1c to be uncontrollably pulled beyond its strength limit, reducing the cross-section and such that the wire material may be cracked resulting in the deterioration of the reliability of the bonding; moreover, the longer reverse stroke consumes a longer time for the bonding operation resulting in reduced productivity. In reducing the excessive load on the wire neck portion 1c by reducing the distance of the reverse stroke, the upward stroke of capillary 2 and clamp 3 in step (e) may be increased so that reverse angle, that is the angle at the permanent bend 1b, is reduced thereby lowering the height of the loop. However, in this case the loop control becomes more difficult, resulting in an increased danger of the bonding wire touching another element, due to the deformation of same which occurs during the transfer molding.

SUMMARY OF THE INVENTION

It is a general object of the invention to provide a method and apparatus of wire bonding that allows a reliable control of the wire loop by reducing the distance of the reverse stroke.

A method of the present invention for wire-bonding of an integrated circuit uses a capillary tube having an axial hole, or passageway, therethrough for guiding a bonding wire therethrough, the capillary moving vertically and horizontally with respect to an integrated circuit so as to bridge a loop between a first bonding position and a subsequent, second bonding position of the wire relative to predetermined elements. The axial hole has a first opening from which an end of the wire extrudes and a second opening opposite the first opening. The method of the invention comprises the steps of heating the end of the wire to form a ball of the wire; performing the first bonding by a nail head bonding method; imposing tension onto the wire by vertically pulling the wire coming out of the second opening. The tension is kept low enough to cause no break of the wire, but high enough to harden a portion of the wire softened by the heating process; and, then, moving the capillary so as to perform the second bonding.

In the wire-bonding apparatus including a spool for supplying the wire and a capillary having an axial hole, or passageway therethrough having a first end and a second opening, where the hole guides the wire therethrough, and the capillary positions the wire for the performance of a first bonding operation on an electrode of an integrated circuit by a nail head bonding method, and is movable vertically and horizontally with respect to said integrated circuit so as to bridge a loop between the first and a second bonding position at which a subsequent, second bonding operation is performed, there further is provided a tension bar located behind the second opening and extending rectangularly to the wire, where the tension bar hooks the wire in a portion thereof between the second opening and the spool located apart from a line extending from the hole. The tension bar is made movable so as to pull the wire via the hole from the first bonding thus completed.

The tension imposed on the wire hardens the portion of the wire, which was softened during the heating process to form a ball for the nail head bonding operation, so as to reliably bridge the first and second bonding positions without sag or deformation of the loop therebetween.

The above-mentioned features and advantages of the present invention, together with other objects and advantages, which will become apparent, will be more fully described hereinafter, with references being made to the accompanying drawings which form a part hereof, wherein like numerals refer to like parts throughout.

A BRIEF DESCRIPTION OF THE DRAWINGS

FIG. 1 schematically illustrates a wire bonder in which the present invention can be embodied;

FIGS. 2(a) to 2(h) schematically illustrate steps of a prior art wire bonding method;

FIGS. 3(a) to 3(g) schematically illustrate the steps of the first preferred embodiment of the present invention;

FIG. 4 schematically illustrates, in a view in an enlarged scale, the nail head bonding operation performed with a capillary tube; and FIG. 5 schematically illustrates a second preferred embodiment of the present invention.

DESCRIPTION OF THE PREFERRED EMBODIMENT

Figure 1:
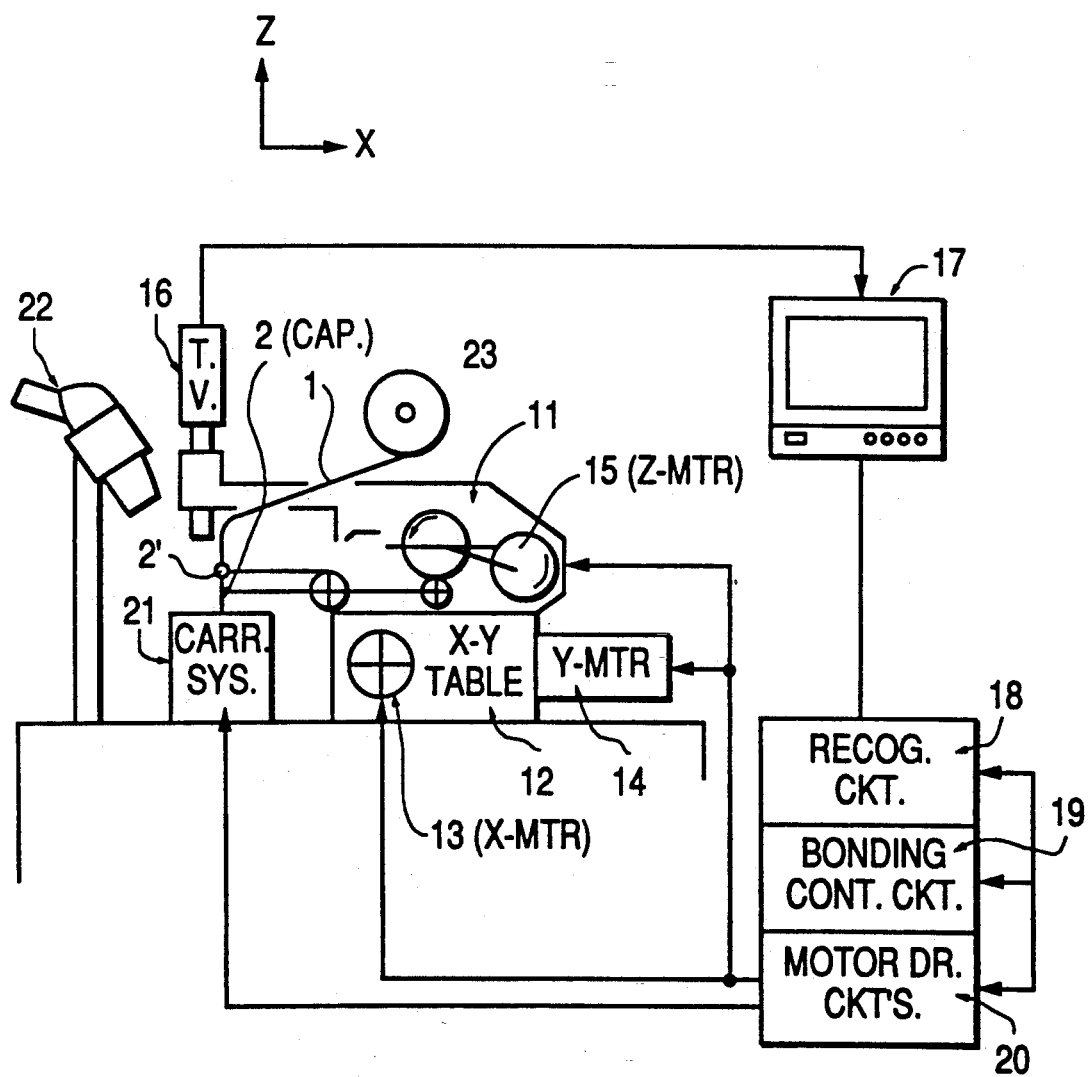
Figure 2H:
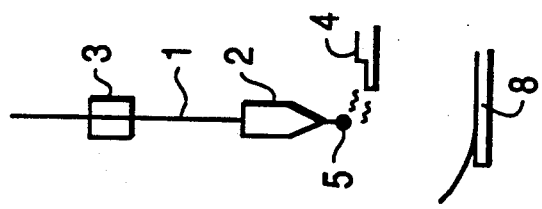
Figure 2G:
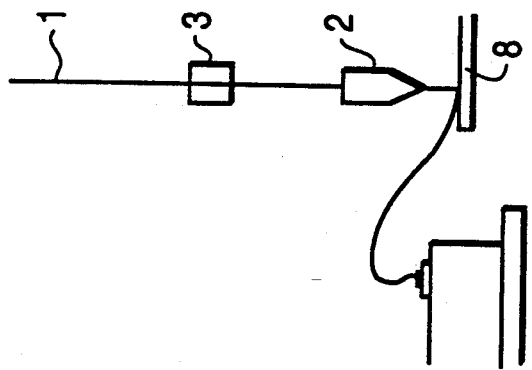
Figure 2F:
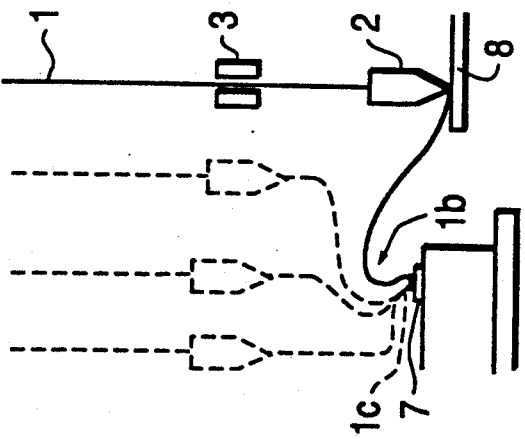
Figure 3G:
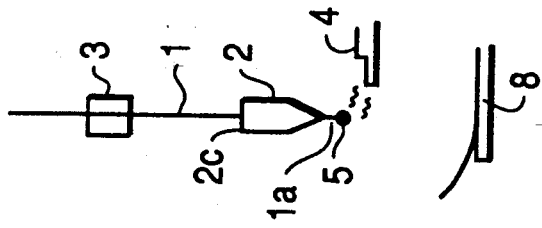
Figure 3F:
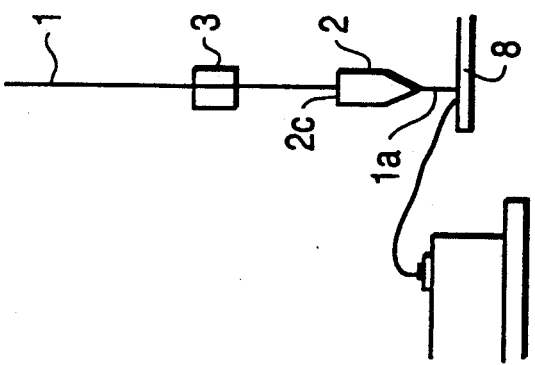
Figure 3E:
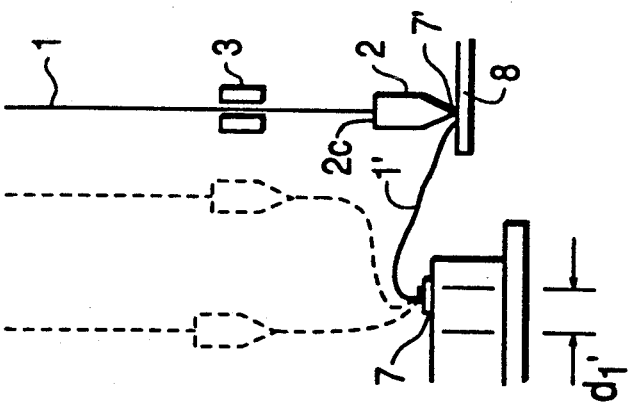

A first preferred embodiment of the method of the present invention is hereinafter described in reference to the steps in FIGS. 3(a) to 3(g). The first preferred embodiment can be embodied substantially in the wire bonder described above in reference to FIG. 1.

Wire 1, typically a 20 to 40 $\mu$m diameter gold wire, is supplied from spool 23 (FIG. 1) and inserted in a hole 2' typically of 40 to 50 $\mu$m diameter provided along the axis of capillary tube 2 and the wire's free, or leading end 1a is extruded from front end 2a (i.e., the lower end in the figure) of the capillary tube 2. Clamp 3, located behind the rear end 2c of capillary 2, moves together with capillary 2 and clamps wire 1 when required. A torch 4 (FIG. 3(g)) generates an electrical discharge arc onto the extruding wire end 1a so that the wire becomes molten and forms a ball 5 as shown FIG. 3(g). A gas torch may be employed to heat the wire top instead of the arc torch.

In the first step, i.e. step (a) of the bonding process, ball 5 has thus formed at the end of the wire.

Figure 4:
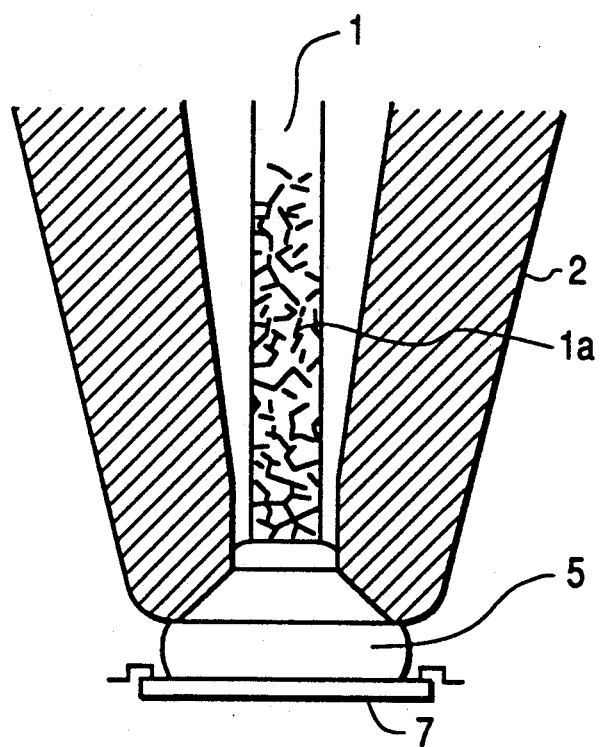

In the next step (b), the first bonding is performed onto an electrode, i.e. a bonding pad, 7 provided on a semiconductor chip 6 by the generally well-known nail head bonding method, and clamp 3 is kept open. In the nail head bonding operation, the capillary 2 comes down and presses the gold ball 5 onto electrode 7 so that ball 5 is welded to electrode 7 as shown in FIG. 4. These steps are substantially not different from those of the prior art method shown in FIGS. 2(a) to 2(h).

In the next step (c), shown in FIG. 3(c), capillary 2 and clamp 3 move upwards while wire 1 is kept as it is; and then clamp 3 is closed to clamp wire 1.

In the next step (d), capillary 2 and clamp 3, which is now clamping wire 1 vertically, move up together so as to pull wire 1 by a predetermined distance $d_2$, for example 0.5 to 3.0 mm, so as to impose a predetermined tension in wire 1; and then clamp 3 is opened. This tension is adequately low so as to not break the wire. The strength and the stiffness of the wire free end portion 1a, which was undesirably softened by the heat employed to melt the free wire end, is enhanced by the work-hardening caused by the tension thus imposed on the wire.

Next, capillary 2 and clamp 3 horizontally move jointly by a distance $d_1'$, for example 0.2 to 0.4 mm, initially in a direction opposite to the direction from the first bonding position to the second bonding position, and at the latter of which the second bonding operation is to be performed. Then, capillary 2 and clamp 3 move up, for example by a distance sufficient to provide the required length of wire for spanning the gap from the first to the second bonding position, e.g., by a distance of 1.0 to 5.5 mm, and subsequently move, for example by 1.0 to 5.5 mm, towards the second bonding position. These movements are illustrated with dotted lines in FIG. 3(e), and are similar to those performed in steps (d) to (f) of the prior art method of FIGS. 2(d) to 2(f) except for the amounts of the strokes. The amount $d_1'$ of the reverse stroke is less than $d_1$ of the prior art. Next, capillary 2 and clamp 3 move directly or via an arc-shaped path, called a loop, to the second bonding position, and the second bonding operation is carried out on frame lead 8 by the generally known stitch bonding method. During these steps, shown in FIGS. 3(e), clamp 3 is kept open.

In the next step (f), capillary 2 and clamp 3 move up for a predetermined distance, for example 0.3 to 1.0 mm, and then clamp 3 is closed in order to prevent an excessive protrusion of the wire. Capillary 2 and clamp 3 further move up together, for example 1.0 mm, so as to break the wire from the second bond, on frame lead 8.

In the next step (g), the wire top extruding from the capillary is made molten by the electric arc generated by the torch 4 to form ball 5 by a surface tension of the molten gold at the end of the wire. Then, the next bonding cycle can be repeated from step (a).

The above-described wire-bonding operation can be carried out by merely modifying the program stored in bonding control circuit 20 of the FIG. 1 bonding apparatus, most of the hardware of which can be employed in the method of the invention, as shown therein, except for the case described below in the second preferred embodiment of the invention.

Figure 5:
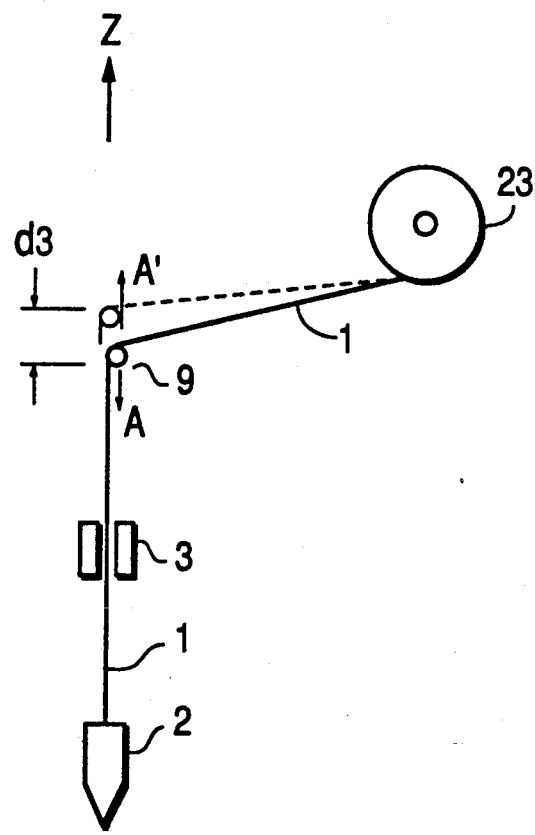

Apparatus of the second preferred embodiment of the present invention is hereinafter described in reference to FIG. 5, which shows the particular part employed in the second embodiment in which all other parts can be the same as the first preferred embodiment. Spool 23 for supplying wire 1 is arranged so as to be displaced laterally from a line extending from capillary 2 and through clamp 3, and there is provided a tension bar 9, formed of a typically 1.5 mm diameter cylinder, which extends in a direction at right angles (i.e., transverse) to wire 1 and engages the wire 1 at the portion thereof between, i.e., intermediate, clamp 3 and spool 23. In other words, wire 1 is bent by and pulled by tension bar 9. For the wire bonder shown in FIG. 1, it has been very usual to provide a tension bar to allow the design freedom of positioning the spool 23. In the present invention, this tension bar is particularly arranged so as to be movable along the center line Z of the capillary and the clamp, as indicated by the oppositely directed arrows A and A', in FIG. 5.

Operation in accordance with the second preferred embodiment of the present invention is hereinafter described. The steps (a) and (b) of the first preferred embodiment are performed to make the first bonding. Next, tension bar 9 is moved by the predetermined distance away from the capillary, i.e., upwards in FIG. 5 and thus to the position illustrated by a dotted line, so as to pull wire 1 via the hole of capillary 2 from the first bonding position by a predetermined stroke $d_3$. If spool 23 releases additional wire 1 when the tension bar 9 pulls the wire, spool 23 or the portion of the wire 1 between the spool 23 and the tension bar 9 may be locked or clamped. Next, the same steps as steps (d) to (g) of the first preferred embodiment are performed.

Thus, in the bonding method of the present invention, the strength and the stiffness of the softened, free-end portion $1a$ is enhanced by the work-hardening, resulting in the following advantageous effects:

1) the damage at the neck portion $1c$ caused from the reverse stroke is reduced;
2) the permanent bend $1b$ is not always necessary to lessen the abnormal sag or deformation of the loop;
3) the loop deformation caused by the subsequent transfer molding operation is reduced;
4) the durability of the neck portion $1c$, to the heat stress caused by the plastic of the package, is enhanced;
5) the amount of the reverse stroke can be reduced; and
6) in addition to the above effects, poor adhesion of the first bond can be detected by the pulling operation.

Summarizing these effects, the method of the present invention allows a reliable loop control causing less abnormal sag or deformation of the loop even though the extent of the reverse bonding is reduced by reducing the reverse stroke. Moreover, the relatively reduced stroke distance of the capillary lessens the travel time of the capillary.

According to the experience of the inventors, the amount of the reverse stroke could be less than half that of the prior art case, to span a 7 mm long loop. For a 3 mm long loop, the reverse stroke could be zero.

Though in either of the first and second preferred embodiments the wire is pulled preferably in the vertical direction, it is apparent that the direction can be arbitrarily deviated from the vertical direction. This is because the spirit of the invention is to intentionally and controllably pull the wire so as to harden the softened wire.

In the foregoing descriptions of both the first and second preferred embodiments, after the tension is given to the wire there has been described the separate vertical movement and horizontal movement of the capillary and the clamp; however, it is apparent that these two (i.e., vertical and horizontal) movements can be combined as a single stroke traveling in a direction directly towards the second bonding position.

Though in the above description the tension bar is referred to as a cylinder, the tension bar may be formed of a rod or roller according to the design choice.

Many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, the detailed embodiments do not limit the invention and, accordingly, all suitable modifications and equivalents may be resorted to, falling within the scope of the invention.

What I claim is:

1. A method of wire-bonding an integrated circuit utilizing a capillary, having an axial hole therein extending between first and second opposite openings, for guiding a wire received from a supply thereof through the second opening and guiding same through the axial hole therein such that the wire extends from the first opening to a free end of the wire, the capillary being selectively movable, both vertically and horizontally, relatively to the surface of an integrated circuit so as to bridge the distance between first and second wire bonding positions on the surface of the integrated circuit, the method comprising the steps of:

advancing the wire from the supply and through the capillary such that the free end of the wire extends from the first capillary opening by a first length;

heating the wire at and adjacent the free end thereof to melt and thereby form a ball of the wire end;

with the capillary selectively moved for positioning the wire end ball at the first bonding position, bonding the wire end ball at the first bonding position by a nail head bonding method;

with the wire end bonded at the first bonding position, imposing tension in the wire by pulling the wire at a position thereof adjacent the second capillary opening, the level of tension being controlled so as not to break the wire but so as to harden the portion of the first length of wire extending from the bonded wire end and which portion was softened by said heating step; and guiding the wire through the capillary such that a second length of wire extends between the first bonding position and the first capillary opening and moving the capillary from the first and to the second bonding position such that the second length of wire extends between the first bonding position and the second bonding position and the wire is positioned, by the capillary, at the second bonding position for the performance of the second bonding operation.

2. A method as recited in claim 1, wherein the tension imposing step is performed by pulling substantially vertically on the wire at a position thereon adjacent the second capillary opening.

3. A method as recited in claim 1, wherein the tension imposing step is performed by engaging the wire with a clamp positioned adjacent the second capillary opening and pulling the wire by the clamp in a substantially vertical direction.

4. The method as recited in claim 1 wherein the tension imposing step is performed by engaging the wire at a position intermediate a fixed supply reel thereof and the second capillary opening and then moving the tension bar so as to elongate the length of the wire extending between the first bonding position at which the wire end is bonded and the position thereof engaged by the tension bar.

5. The method as recited in claim 1, wherein the tension bar comprises a rod.

6. The method recited in claim 5, wherein the tension bar comprises a roller.

7. A method of wire-bonding an integrated circuit utilizing a capillary, having an axial hole therein extending between first and second opposite openings, for guiding a wire received from a supply thereof through the second opening and guiding same through the axial hole therein such that the wire extends from the first opening to a free end of the wire, the capillary being selectively movable, both vertically and horizontally, relatively to the surface of an integrated circuit so as to bridge the distance between first and second wire bonding positions on the surface of the integrated circuit, the method comprising the steps of:

advancing the wire from the supply and through the capillary such that the free end of the wire extends from the first capillary opening by a first length;

heating the wire at and adjacent the free end thereof to melt and thereby form a ball of the wire end;

with the capillary selectively moved for positioning the wire end ball at the first bonding position, bonding the wire end ball at the first bonding position by a nail head bonding method;

with the wire end bonded at the first bonding position, firmly clamping the wire with a clamp at a position thereof adjacent the second capillary opening and pulling the wire with the clamp thereby to impose tension in the wire, the level of tension being controlled so as not to break the wire but so as to harden the portion of the first length of wire extending from the bonded wire end and which portion was softened by said heating step; and guiding the wire through the capillary such that a second length of wire extends between the first bonding position and the first capillary opening and moving the capillary from the first and to the second bonding position such that the second length of wire extends between the first bonding position and the second bonding position and the wire is positioned, by the capillary, at the second bonding position for the performance of the second bonding operation.

* * * * *

UNITED STATES PATENT AND TRADEMARK OFFICE
CERTIFICATE OF CORRECTION

PATENT NO. : 5,226,582
DATED : July 13, 1993
INVENTOR(S) : KUBOTA et al.

It is certified that error appears in the above-indentified patent and that said Letters Patent is hereby corrected as shown below:

Col. 8, line 5, change "claim 1" to --claim 4--.

Signed and Sealed this

Nineteenth Day of July, 1994

Attest:

BRUCE LEHMAN

Attesting Officer    Commissioner of Patents and Trademarks